United States Patent
Jiao et al.

(10) Patent No.: US 11,770,902 B2
(45) Date of Patent: Sep. 26, 2023

(54) CIRCUIT BOARD, PREPARATION METHOD THEREOF, AND ELECTRONIC DEVICE

(71) Applicant: WUXI SHENNAN CIRCUITS CO., LTD., Wuxi (CN)

(72) Inventors: Yunfeng Jiao, Wuxi (CN); Lei You, Wuxi (CN); Zhicheng Yang, Wuxi (CN); Lihua Zhang, Wuxi (CN); Hua Miao, Wuxi (CN)

(73) Assignee: WUXI SHENNAN CIRCUITS CO., LTD., Wuxi (CN)

( * ) Notice: Subject to any disclaimer, the term of this patent is extended or adjusted under 35 U.S.C. 154(b) by 108 days.

(21) Appl. No.: 17/498,767

(22) Filed: Oct. 12, 2021

(65) Prior Publication Data

US 2022/0240391 A1    Jul. 28, 2022

Related U.S. Application Data

(63) Continuation of application No. PCT/CN2021/084601, filed on Mar. 31, 2021.

(30) Foreign Application Priority Data

Jan. 27, 2021   (CN) .......................... 202110114037.7

(51) Int. Cl.
  *H05K 1/02*     (2006.01)
  *H05K 3/32*     (2006.01)
  *H05K 1/05*     (2006.01)

(52) U.S. Cl.
  CPC ............ *H05K 3/32* (2013.01); *H05K 1/0296* (2013.01); *H05K 1/05* (2013.01); *H05K 2201/03* (2013.01); *H05K 2201/095* (2013.01)

(58) Field of Classification Search
  CPC .... H05K 1/0207; H05K 1/021; H05K 1/0204; H05K 1/0206; H05K 1/0209; H05K 1/0224
  See application file for complete search history.

(56) References Cited

U.S. PATENT DOCUMENTS 9,661,738 B1 * 5/2017 Jacobsson ............ H05K 1/0206

FOREIGN PATENT DOCUMENTS

| CN | 101262746 A | 9/2008 |
| CN | 104900609 A | 9/2015 |
| CN | 106304634 A | 1/2017 |

OTHER PUBLICATIONS

International search report, International Application No. PCT/CN2021/084601, dated Nov. 2, 2021 (13 pages).

* cited by examiner

*Primary Examiner* — Jeremy C Norris

(57) ABSTRACT

A circuit board, a preparation method thereof, and an electronic device are provided. The circuit board includes: a substrate, defining a first through-hole; a metal block, embedded in the first through-hole and fixedly connected to the substrate; a conductive line layer, arranged on at least one side surface of the substrate; wherein the conductive line layer partially covers an opening of the first through-hole on a corresponding side surface of the substrate; and a conductive channel, penetrating the conductive line layer and the metal block in turn. The conductive channel comprises a second through-hole and a conductive medium plated on a wall of the second through-hole; an end of the conductive medium is connected to the conductive line layer, and another end of the conductive medium is connected to the metal block.

20 Claims, 3 Drawing Sheets

CIRCUIT BOARD, PREPARATION METHOD THEREOF, AND ELECTRONIC DEVICE

CROSS REFERENCE

The present application is a continuation-application of International (PCT) Patent Application No. PCT/CN2021/084601, filed on Mar. 31, 2021, which claims foreign priority of Chinese Patent Application No. 202110114037.7, filed on Jan. 27, 2021, in the China National Intellectual Property Administration, the entire contents of which are hereby incorporated by reference.

TECHNICAL FIELD

The present disclosure relates to the field of printed circuit board technologies, and in particular to a circuit board, a preparation method thereof, and an electronic device.

BACKGROUND

In an existing printed circuit board, multiple electronic components may be arranged. To dissipate heat from a predetermined electronic component, a metal base may usually be buried in the printed circuit board. The electronic component may be arranged directly above the metal base and connected to the metal base, such that the electronic component can be dissipated through the metal base.

In the related art, an area corresponding to the metal base on the printed circuit board usually cannot be arranged with conductive lines, which leads to the problem of poor utilization of wiring space on the printed circuit board.

SUMMARY OF THE DISCLOSURE

The present disclosure provides a circuit board and a preparation method thereof, to solve the problem that the area corresponding to a metal base on a printed circuit board in the prior art usually cannot be provided with conductive lines, resulting in poor utilization of wiring space on the printed circuit board.

To solve the above technical problem, a technical solution adopted by the present disclosure is to provide a circuit board, comprising: a substrate, defining a first through-hole; a metal block, embedded in the first through-hole and fixedly connected to the substrate; a conductive line layer, arranged on at least one side surface of the substrate; wherein the conductive line layer partially covers an opening of the first through-hole on a corresponding side surface of the substrate; and a conductive channel, penetrating the conductive line layer and the metal block in turn; wherein the conductive channel comprises a second through-hole and a conductive medium plated on a wall of the second through-hole; an end of the conductive medium is connected to the conductive line layer, and another end of the conductive medium is connected to the metal block.

In some embodiments, the metal block is fixedly connected to the substrate through a connection layer; the connection layer is configured to fill a gap between the first through-hole and the metal block.

In some embodiments, the second through-hole is made of a semi-curable material.

In some embodiments, the conductive channel comprises a plurality of conductive channels, and at least two of the plurality of conductive channels are spaced apart; the conductive line layer is electrically connected to the metal block through at least one of the plurality of conductive channels.

In some embodiments, each of opposite sides of the substrate is covered with the conductive line layer; two layers of the conductive line layer partially cover openings of the first through-hole located on the opposite sides of the substrate; each of the two layers of the conductive line layer is electrically connected to the metal block through at least one of the plurality of conductive channels.

In some embodiments, the metal block is accommodated in a holding space defined by the connection layer, and the connection layer does not protrude out of first through-hole; the conductive channel penetrates the connection layer and is connected to the metal block.

In some embodiments, the conductive line layer comprises a plurality of conductive lines having a predetermined pattern.

To solve the above technical problem, another technical solution adopted by the present disclosure is to provide a circuit board preparation method, comprising: preparing a substrate, wherein the substrate defines a first through-hole; embedding a metal block in the first through-hole for fixedly connecting the metal block and an inner wall of the first through-hole; arranging a conductive line layer on at least one side surface of the substrate, wherein the conductive line layer partially covers an opening of the first through-hole on a corresponding side surface of the substrate; and arranging a conductive channel connected to the metal block in a side of the conductive line layer back to the substrate, such that the conductive line layer is electrically connected to the metal block through the conductive channel.

In some embodiments, the embedding the metal block in the first through-hole comprises: preparing a connection block, wherein the connection block defines a holding space; placing the metal block in the holding space, such that the metal block and the connection block form an assembly; and pressing the assembly into the first through-hole of the substrate.

In some embodiments, the connection block has a predetermined shape matching a shape of the first through-hole or being larger than the shape of the first through-hole.

In some embodiments, the arranging the conductive channel connected to the metal block in the side of the conductive line layer back to the substrate comprises: defining a second through-hole connected to the metal block from the side of the conductive line layer back to the substrate; and filling a conductive medium in the second through-hole.

In some embodiments, the second through-hole is formed by laser drilling and forming; the conductive medium is formed on a wall of the second through-hole by electroplating forming.

In some embodiments, after the arranging the conductive channel connected to the metal block in the side of the conductive line layer back to the substrate, the method further comprises: patterning the conductive line layer to form a plurality of conductive lines having a predetermined pattern.

To solve the above technical problem, further another technical solution adopted by the present disclosure is to provide an electronic device, comprising: a circuit board as above.

In contrast to the prior art, the present disclosure provides a circuit board, a preparation method thereof, and an electronic device. The conductive line is electrically connected to the metal block through the conductive channel, and a position adjacent to the conductive line may be configured to arrange other conductive lines. The other conductive lines described herein may be spaced or connected to the conductive lines. A projection of the other conductive lines in a plane perpendicular to the axis of the conductive channel can at least partially coincide with the projection of the metal block. Therefore, the wiring density of the board can be increased, thereby improving the space utilization efficiency of the board.

BRIEF DESCRIPTION OF THE DRAWINGS

In order to more clearly describe the technical solutions in the embodiments of the present disclosure, the following will briefly introduce the drawings required in the description of the embodiments. Obviously, the drawings in the following description are only some embodiments of the present disclosure. For those skilled in the art, other drawings can be obtained based on these drawings without creative work.

DETAILED DESCRIPTION

The following will be a clear and complete description of the technical solutions in the embodiments of the present disclosure in conjunction with the accompanying drawings in the embodiments of the present disclosure. Obviously, the described embodiments are only a part of the embodiments of the present disclosure, and not all of them. Based on the embodiments in the present disclosure, all other embodiments obtained by those skilled in the art without making creative labor fall within the scope of the present disclosure.

It should be noted that when there are directional indications (such as up, down, left, right, forward, back . . . ) involved in the embodiments of the present disclosure, the directional indications are only intended to explain a relative position relationship, movement, etc. between components in a particular attitude (as shown in the attached drawings). When the particular attitude is changed, the directional indications are also changed accordingly.

In addition, when there is a description of "first", "second", etc. in the embodiments of the present disclosure, the description of "first", "second", etc. is intended for descriptive purposes only and is not to be understood as indicating or implying its relative importance or implicitly specifying the number of indicated technical features. Thus, features qualified with "first" and "second" may explicitly or implicitly include at least one such feature. In addition, the technical solutions of each embodiment may be combined with each other, but only on the basis of the technical solutions that can be realized by those skilled in the art. When the combination of technical solutions appears to be contradictory or unrealizable, such combination of technical solutions shall be considered not to exist and not to be within the scope claimed in the present disclosure.

Figure 1:
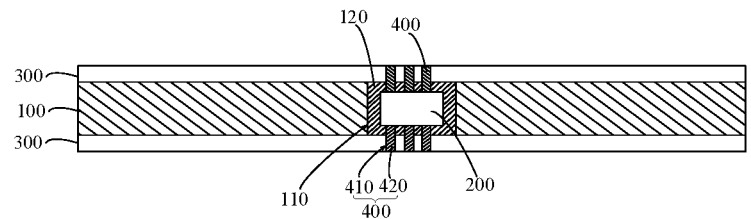
FIG. 1 is a structural schematic view of a circuit board according to an embodiment of the present disclosure.

Referring to FIG. 1, FIG. 1 is a structural schematic view of a circuit board according to an embodiment of the present disclosure.

The circuit board 10 includes a substrate 100, a metal block 200, a conductive line layer 300, and a conductive channel 400.

The substrate 100 defines a first through-hole 110. The metal block 200 is embedded in the first through-hole 110 and fixedly connected to the substrate 100.

The metal block 200 may be embedded in the first through-hole 110 through a connection layer 120. Specifically, the connection layer 120 is configured to fill a gap between the first through-hole 110 and the metal block 200, such that the metal block 200 is fixedly connected to an inner wall of the first through-hole 110 through the connection layer 120.

In the embodiment, the connection layer 120 may be arranged around the metal block 200, i.e., the connection layer 120 defines a holding space inside the connection layer 120, and the metal block 200 is accommodated in the holding space inside the connection layer 120. In the embodiment, the material of the connection layer 120 may be a semi-curable material, for example, may be a polypropylene (PP) material.

Specifically, the metal block 200 may be arranged into the holding space inside the connection layer 120, and then a assembly formed by the metal block 200 and the connection layer 120 is pressed into the first through-hole 110 and heated at the same time, such that the connection layer 120 can be filled in the gap between the first through-hole 110 and the metal block 200. In this way, after the connection layer 120 is cured, the metal block 200 may be fixedly connected to the substrate 100. A thickness of the metal block 200 is less than or equal to a thickness of the substrate 100. When the metal block 200 is arranged into the first through-hole 110, the metal block 200 does not protrude out of the first through-hole 110.

The conductive line layer 300 is covered on a side surface with an opening of the first through-hole 110 of the substrate 100. The conductive line layer 300 may be formed of a metal conductive material to form a conductive metal part. For example, a metal sheet such as copper foil may be arranged on the surface of the substrate 100 to form the conductive line layer 300.

In the embodiment, the circuit board 10 further includes the conductive channel 400. The conductive channel 400 penetrates the conductive line layer 300 and is then electrically connected to the metal block 200. Specifically, the conductive channel 400 includes a second through-hole 410 and a metal medium 420 arranged in the second through-hole 410. The second through-hole 410 penetrates the conductive line layer 300 and the connection layer 120 in turn and is connected to a surface of the metal block 200. The metal medium 420 is filled in the second through-hole 410. An end of the metal medium 420 is electrically connected to a preset conductive line in the conductive line layer 300, and the other end of the metal medium 420 is electrically connected to the metal block 200.

In the embodiment, the second through-hole 410 may be formed by laser drilling or mechanical drilling. By punching a hole into the first through-hole 110 of the substrate 100 from a side of the conductive line layer 300 back to the substrate 100, the second through-hole 410 can be formed that connects to the surface of the metal block 200. Therefore, by using laser drilling or mechanical drilling of the conductive line layer 300 to open the second through-hole 410, and then arranging the metal medium 420 in the second through-hole 410, a compact heat dissipation channel may be formed, such that a part of the conductive line layer 300 above the opening of the first through-hole 110 may also be performed with wiring operations, thereby improving the space utilization efficiency of the circuit board.

In the embodiment, the metal medium 420 may be filled within the second through-hole 410 by electroforming of electroplating. The metal medium 420 may be completely filled within an interior space of the second through-hole 410. In other embodiments, the metal medium 420 may also be affixed to an inner wall of the second through-hole 410 and a central portion of the second through-hole 410 is not filled with the metal medium 420.

Referring further to FIG. 1.

In the embodiment, the number of the conductive channels 400 may be more than one, and each of the conductive channels 400 extends from an opening position of the first through-hole 110 to the surface of the metal block 200. The plurality of conductive channels 400 are spaced apart, and the conductive line layer 300 may be electrically connected to the metal block 200 through at least one of the conductive channels 400.

The conductive line layer 300 may be patterned such that the conductive line layer 300 may form a plurality of conductive lines that form a predetermined pattern.

In the embodiment, an end of a conductive channel 400 may be electrically connected to one of the conductive lines, and the other end is electrically connected to the metal block 200. The conductive line electrically connected to the conductive channel 400 may be a pad for soldering fixed an electronic component. Heat generated by the electronic component may be transferred to the metal block 200 through the conductive line and the conductive channel 400, and then exported through the metal block 200.

In the embodiment, the conductive line layer 300 is electrically connected to the metal block 200 through the conductive channel(s) 400, and a position adjacent to the conductive line may be configured to arrange other conductive lines. The other conductive lines described herein may be spaced or connected to the conductive lines. A projection of the other conductive lines in a plane perpendicular to an axis of the conductive channel(s) 400 may be at least partially coincident with a projection of the metal block 200. Therefore, a wiring density of the circuit board 10 may be increased, thereby improving the space utilization efficiency of the circuit board 10.

In the embodiment, two sides of the substrate 100 with different openings of the first through-hole 110 are each covered with the conductive line layer 300 as described above. Each conductive line layer 300 may include the at least one conductive channel 400 connected to a corresponding surface of the metal block 200 and electrically connected to the metal block 200.

The electronic component may be arranged on the conductive line layer 300 on a side of the substrate 100, and the heat generated by the electronic component may be conducted to the other side of the substrate 100 through the at least one conductive channel 400 and the metal block 200.

Figure 2:
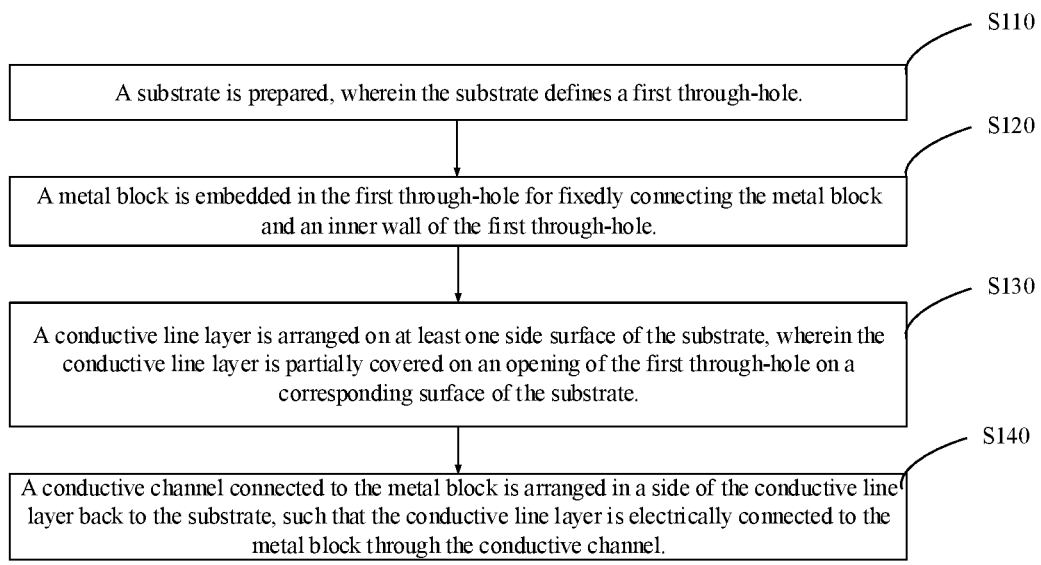
FIG. 2 is a flowchart of a circuit board preparation method according to an embodiment of the present disclosure.

Referring to FIG. 2, and further referring to FIGS. 3a-3e, FIG. 2 is a flowchart of a circuit board preparation method according to an embodiment of the present disclosure, and FIGS. 3a-FIG. 3e are schematic views of structural changes of a circuit board prepared in the method as shown in FIG. 2.

The circuit board preparation method may include operations at blocks as followed.

At block S110: A substrate is prepared, wherein the substrate defines a first through-hole.

In this step, the substrate is made of insulating material. The substrate may be made of PP material, or other insulating material, without limitation herein.

Figure 3A:
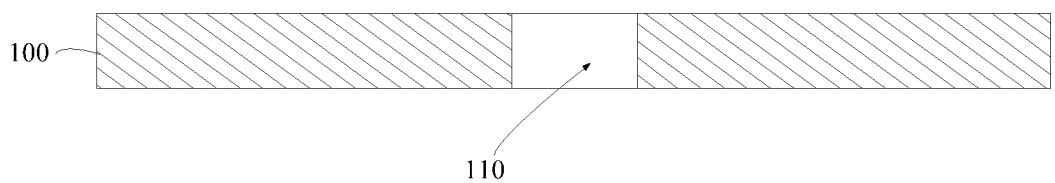
FIG. 3a is a schematic view of a structural change of a circuit board prepared in the method as shown in FIG. 2.

In this step, referring to FIG. 3a, the preparing the substrate includes: forming the substrate 100 with a predetermined shape and size, and then defining the first through-hole 110 at a predetermined position of the substrate 100. The number of the first through-hole 110 may be one or more.

At block S120: A metal block is embedded in the first through-hole for fixedly connecting the metal block and an inner wall of the first through-hole.

Figure 3B:
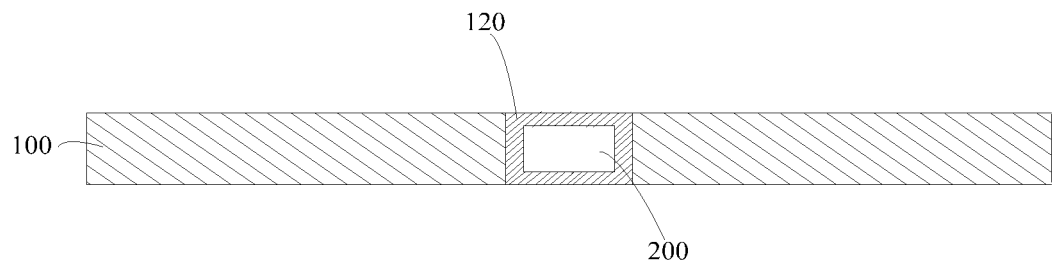
FIG. 3b is a schematic view of another structural change of a circuit board prepared in the method as shown in FIG. 2.

In this step, referring to FIG. 3b, when the first through-hole 110 is defined in the substrate 100, the metal block 200 in a suitable size may be selected and embedded in the first through-hole 110 such that the metal block 200 is fixedly connected to the inner wall of the first through-hole 110. The metal block 200 in the suitable size may be pre-formed by casting or machining and other manufacturing methods.

In this step, after the metal block 200 is embedded in the first through-hole 110, the metal block 200 does not protrude out of the first through-hole 110.

The embedding the metal block 200 in the first through-hole may specifically include the following operations.

a. A connection block with a predetermined shape is prepared, and a holding space is defined in the connection block.

The connection block has a predetermined shape, which may be set to match the shape of the first through-hole 110, or the predetermined shape may be slightly larger than the shape of the first through-hole 110. For example, when the first through-hole 110 is cylindrical, the connection block may be a cylindrical shape with dimensions slightly larger than the cylindrical first through-hole 110, i.e., the radius of the connection block may be slightly greater than the radius of the first through-hole 110, or the height of the connection block may be slightly greater than the depth of the first through-hole 110.

In this step, the holding space is defined in the connection block. The holding space may be formed by machining or laser drilling the connection block.

b. The metal block 200 is placed in the holding space, such that the metal block 200 and the connection block form an assembly.

When the holding space is defined in the connection block, the metal block 200 is placed in the holding space; then an opening of the holding space is closed, such that the metal block 200 may be encased in the holding space of the connection block. Therefore, the metal block 200 may form a fixedly connected assembly with the connection block.

c. The assembly is pressed into the first through-hole of the substrate.

The assembly formed by the metal block 200 and the connection block is arranged into the first through-hole 110 by means of hot pressing, which in turn enables the assembly formed by the metal block 200 and the connection block to be filled in the first through-hole 110.

Since the connection block is made of semi-curing material. When the hot pressing is completed, the assembly formed by the metal block 200 and the connection block may be filled in the first through-hole 110, and the semi-curing sheet may be fixedly connected to the inner wall of the first through-hole 110. That is, the metal block 200 may be fixedly connected to the inner wall of the first through-hole 110 by the connection block. In this way, the metal block 200 is fixedly connected to the substrate 100.

The connection block may be configured to form a connection layer 120.

At block S130: A conductive line layer is arranged on at least one side surface of the substrate, wherein the conductive line layer is partially covered on an opening of the first through-hole on a corresponding surface of the substrate.

Figure 3C:
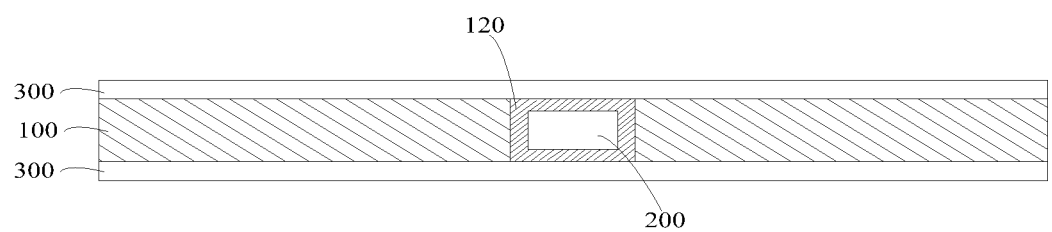
FIG. 3c is a schematic view of further another structural change of a circuit board prepared in the method as shown in FIG. 2.

In this step, referring to FIG. 3*c*, when the assembly formed by the metal block and the connection block is embedded in the first through-hole, the conductive line layer 300 is covered on the substrate. The conductive line layer 300 is covered on a surface of the substrate with an opening of the first through-hole.

In this step, the conductive line layer 300 may be formed by a metal film, for example, the metal film may be a copper foil. The conductive line layer 300 may be arranged on a surface of at least one side of the substrate 100, and a part of the conductive line layer 300 may be covered on an opening of the first through-hole 110 located on a corresponding surface of the substrate 100. The conductive line layer 300 may be directly affixed to the surface of the substrate 100; or the conductive line layer 300 may be fixed to the surface of the substrate 100 by using an adhesive layer. The adhesive layer may be formed by a semi-curing sheet.

The conductive line layer 300 may also be pressed onto the surface of the substrate 100 by means of heating and pressing. When the conductive line layer 300 is pressed on the substrate 100, the semi-curing sheet is attached to the surface of the substrate 100, and the conductive line layer is arranged on a surface of the semi-curing sheet back to the substrate 100. By the hot pressing operation, the semi-curing sheet can form the adhesive layer to fixedly bond the conductive line layer 300 to the substrate 100.

In this step, the conductive line layer 300 may be covered on both sides of the substrate 100 with different openings of the first through-hole 110.

At block S140: A conductive channel connected to the metal block is arranged in a side of the conductive line layer back to the substrate, such that the conductive line layer is electrically connected to the metal block through the conductive channel.

Figure 3D:
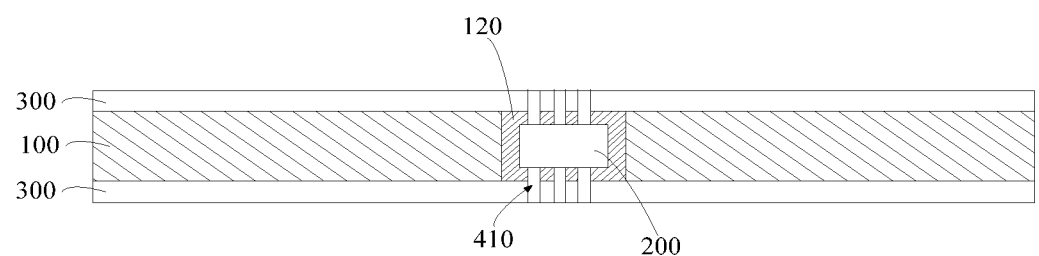
FIG. 3d is a schematic view of further another structural change of a circuit board prepared in the method as shown in FIG. 2.
Figure 3E:
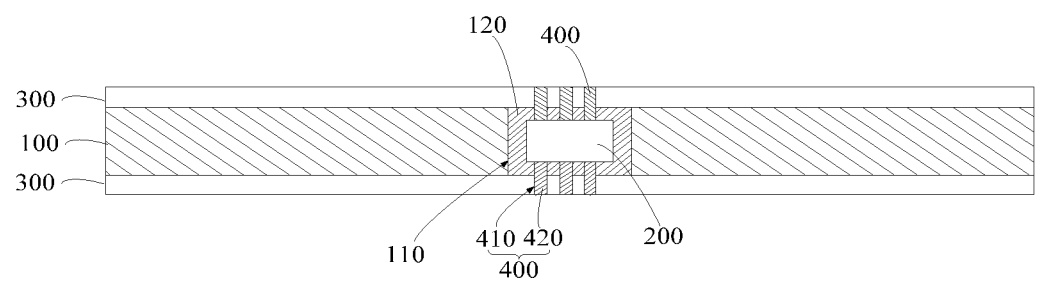
FIG. 3e is a schematic view of further another structural change of a circuit board prepared in the method as shown in FIG. 2.

In this step, referring to FIG. 3*d* and FIG. 3*e*, when the conductive line layer 300 is covered to the substrate 100, the conductive channel 400 connected to the metal block 200 may be arranged from the side of the conductive line layer 300 into the first through-hole 110 of the substrate 100.

The number of the conductive channels 400 may be one or more.

When the substrate 100 is arranged with the conductive line layer 300 on two sides with different openings of the first through-hole 110, i.e., when both sides of the substrate 100 are covered with the conductive line layers 300 on opposite sides. At least one conductive channel 400 connected to the metal block 200 may be arranged in each of the conductive line layers 300.

The conductive channel 400 includes a second through-hole 410 and a metal medium 420 arranged in the second through-hole 410. The step of forming the conductive channel 420 may include operations as followed.

The second through-hole 420 connected to the metal block is defined from the side of the conductive line layer 300 back to the substrate 100. The second through-hole 420 penetrates the conductive line layer 300 and connection layer 120 in turn to connect to the surface of the metal block 200. The second through-hole 410 can be formed by means of mechanical drilling, or can also be formed by means of laser drilling.

Then, the metal medium 420 is filled in the second through-hole 410, such that an end of the metal medium 420 is connected to the conductive line layer 300 and the other end is directly connected to the metal block 200.

The metal medium 420 may be filled in the second through-hole 410 by electroplating; or it is also possible to prepare a liquefied material of the metal medium first, and then the liquefied material of the metal medium is injected into the second through-hole 410 and solidified, such that the conductive channel 400 may be achieved.

Figure 4:
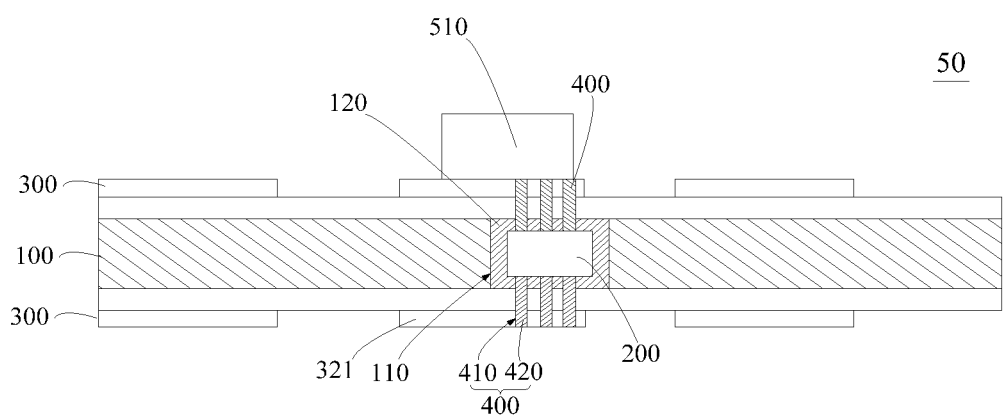
FIG. 4 is a structural schematic view of an electronic device according to an embodiment of the present disclosure.

Further, the present disclosure provides an electronic device. Referring to FIG. 4, FIG. 4 is a structural schematic view of an electronic device according to an embodiment of the present disclosure.

The electronic device 50 includes a circuit board 10 and a functional component 510 as previously described. The functional component 510 may be a power device such as a chip, controller, etc., and the functional component 510 may be mounted on a conductive line layer 300 on a side of the substrate 100.

Each conductive line layer 300 may be patterned to form a plurality of conductive lines 321 with a predetermined pattern, and both conductive line layers 300 on opposite sides of the substrate 100 have at least one conductive line 321 to connect to the metal block 200 via the conductive channel 400.

The functional component 510 may be mounted on the conductive line layer 300 on a side of the substrate 100 and may be further connected to the conductive line layer 300 on the other side of the substrate 100 through the metal block 200 and the conductive channel 400 on the other side of the metal block 200, such that heat generated by the functional component 510 can be transferred to the conductive line layer 300 on the other side through the conductive channel 400 and the metal block 200 to achieve the heat dissipation function.

In summary, the present disclosure provides a circuit board and a preparation method thereof. A conductive line is electrically connected to the metal block through the conductive channel, and a position adjacent to the conductive line may be configured to arrange other conductive lines. The other conductive lines described herein may be spaced or connected to the conductive line. A projection of the other conductive lines in a plane perpendicular to an axis of the conductive channel may be at least partially coincident with a projection of the metal block. Therefore, a wiring density of the circuit board may be increased, thereby improving the space utilization efficiency of the circuit board.

The above description is only an implementation of the present disclosure, and is not intended to limit the scope of the present disclosure. Any equivalent structure or equivalent process transformation using the contents of the specification and the accompanying drawings, or direct or indirect application in other related technical fields, is included in the scope of the present disclosure.

What is claimed is:

1. A circuit board, comprising:
   a substrate, defining a first through-hole;
   a metal block, embedded in the first through-hole and fixedly connected to the substrate;
   a conductive line layer, arranged on at least one side surface of the substrate; wherein the conductive line layer partially covers an opening of the first through-hole on a corresponding side surface of the substrate; and a conductive channel, penetrating the conductive line layer and extending to the metal block;

wherein the conductive line layer defines at least one third through-hole corresponding to the conductive channel; the conductive channel comprises a second through-hole and a conductive medium plated on a wall of the second through-hole; and an end of the conductive medium is connected to the conductive line layer, and another end of the conductive medium is connected to the metal block.

2. The circuit board according to claim 1, wherein the metal block is fixedly connected to the substrate through a connection layer; the connection layer is configured to fill a gap between the first through-hole and the metal block.

3. The circuit board according to claim 2, wherein the second through-hole is made of a semi-curable material.

4. The circuit board according to claim 2, wherein the metal block is accommodated in a holding space defined by the connection layer, and the connection layer does not protrude out of first through-hole; the conductive channel penetrates the connection layer and is connected to the metal block.

5. The circuit board according to claim 2, wherein the connection layer only surrounds the metal block.

6. The circuit board according to claim 1, wherein the conductive channel comprises a plurality of conductive channels, and at least two of the plurality of conductive channels are spaced apart; the conductive line layer is electrically connected to the metal block through at least one of the plurality of conductive channels.

7. The circuit board according to claim 6, wherein each of opposite sides of the substrate is covered with the conductive line layer; two layers of the conductive line layer partially cover openings of the first through-hole located on the opposite sides of the substrate;

each of the two layers of the conductive line layer is electrically connected to the metal block through at least one of the plurality of conductive channels.

8. The circuit board according to claim 1, wherein the conductive line layer comprises a plurality of conductive lines having a predetermined pattern.

9. A circuit board preparation method, comprising:

preparing a substrate, wherein the substrate defines a first through-hole;

embedding a metal block in the first through-hole for fixedly connecting the metal block and an inner wall of the first through-hole;

arranging a conductive line layer on at least one side surface of the substrate, wherein the conductive line layer partially covers an opening of the first through-hole on a corresponding side surface of the substrate; and arranging a conductive channel connected to the metal block in a side of the conductive line layer back to the substrate, such that the conductive line layer is electrically connected to the metal block through the conductive channel, and at least one third through-hole corresponding to the conductive channel is defined in the conductive line layer.

10. The circuit board preparation method according to claim 9, wherein the embedding the metal block in the first through-hole comprises:

preparing a connection block, wherein the connection block defines a holding space;

placing the metal block in the holding space, such that the metal block and the connection block form an assembly; and pressing the assembly into the first through-hole of the substrate.

11. The circuit board preparation method according to claim 10, wherein the connection block has a predetermined shape matching a shape of the first through-hole or being larger than the shape of the first through-hole.

12. The circuit board preparation method according to claim 10, wherein the arranging the conductive channel connected to the metal block in the side of the conductive line layer back to the substrate comprises:

defining a second through-hole connected to the metal block from the side of the conductive line layer back to the substrate; and filling a conductive medium in the second through-hole.

13. The electronic device according to claim 12, wherein the metal block is fixedly connected to the substrate through a connection layer; the connection layer is configured to fill a gap between the first through-hole and the metal block.

14. The electronic device according to claim 13, wherein the metal block is accommodated in a holding space defined by the connection layer, and the connection layer does not protrude out of first through-hole; the conductive channel penetrates the connection layer and is connected to the metal block.

15. The electronic device according to claim 13, wherein the connection layer only surrounds the metal block.

16. The circuit board preparation method according to claim 9, after the arranging the conductive channel connected to the metal block in the side of the conductive line layer back to the substrate, further comprising:

patterning the conductive line layer to form a plurality of conductive lines having a predetermined pattern.

17. An electronic device, comprising: a circuit board and a functional component;

wherein the circuit board comprises:

a substrate, defining a first through-hole;

a metal block, embedded in the first through-hole and fixedly connected to the substrate;

a conductive line layer, arranged on at least one side surface of the substrate; wherein the conductive line layer partially covers an opening of the first through-hole on a corresponding side surface of the substrate; and a conductive channel, penetrating the conductive line layer and extending to the metal block; wherein the conductive line layer defines at least one third through-hole corresponding to the conductive channel; the conductive channel comprises a second through-hole and a conductive medium plated on a wall of the second through-hole; and an end of the conductive medium is connected to the conductive line layer, and another end of the conductive medium is connected to the metal block;

wherein the functional component is arranged on the conductive line layer on a side of the substrate.

18. The electronic device according to claim 17, wherein the conductive channel comprises a plurality of conductive channels, and at least two of the plurality of conductive channels are spaced apart; the conductive line layer is electrically connected to the metal block through at least one of the plurality of conductive channels.

19. The electronic device according to claim 18, wherein each of opposite sides of the substrate is covered with the conductive line layer; two layers of the conductive line layer partially cover openings of the first through-hole located on the opposite sides of the substrate;

each of the two layers of the conductive line layer is electrically connected to the metal block through at least one of the plurality of conductive channels.

20. The electronic device according to claim 17, wherein the conductive line layer comprises a plurality of conductive lines having a predetermined pattern.

\* \* \* \* \*